United States Patent
Kozerke et al.

(10) Patent No.: US 7,330,027 B2
(45) Date of Patent: Feb. 12, 2008

(54) SYSTEM AND METHOD OF MAGNETIC RESONANCE IMAGING FOR PRODUCING SUCCESSIVE MAGNETIC RESONANCE IMAGES

(75) Inventors: Sebastian Kozerke, Hedingen (CH); Jeffrey Tsao, Brookline, MA (US); Peter Boesiger, Ennetbaden (CH); Klaas Pruessmann, Zürich (CH)

(73) Assignee: Universitat Zurich, Zurich (CH)

( * ) Notice: Subject to any disclaimer, the term of this patent is extended or adjusted under 35 U.S.C. 154(b) by 0 days.

(21) Appl. No.: 10/563,177

(22) PCT Filed: Jun. 24, 2004

(86) PCT No.: PCT/CH2004/000387

§ 371 (c)(1),
(2), (4) Date: Apr. 25, 2006

(87) PCT Pub. No.: WO2005/003804

PCT Pub. Date: Jan. 13, 2005

(65) Prior Publication Data

US 2006/0208730 A1    Sep. 21, 2006

(30) Foreign Application Priority Data

Jul. 2, 2003    (EP)    ................... 03015012

(51) Int. Cl.
*G01V 3/00*    (2006.01)
(52) U.S. Cl. .................................................. 324/307
(58) Field of Classification Search ......... 324/300–322
See application file for complete search history.

(56) References Cited

U.S. PATENT DOCUMENTS

| | | | | |
|---|---|---|---|---|
| 6,285,187 B1 * | 9/2001 | Mock | .......................... | 324/309 |
| 6,411,089 B1 * | 6/2002 | Anand et al. | ................ | 324/309 |
| 6,487,435 B2 * | 11/2002 | Mistretta et al. | ............ | 600/420 |
| 6,529,001 B2 * | 3/2003 | Mock | .......................... | 324/309 |
| 6,630,828 B1 * | 10/2003 | Mistretta et al. | ............ | 324/309 |
| 6,671,536 B2 * | 12/2003 | Mistretta | .................... | 600/410 |
| 6,771,068 B2 * | 8/2004 | Dale et al. | .................. | 324/307 |
| 6,876,201 B2 * | 4/2005 | Takizawa et al. | ........... | 324/318 |
| 6,954,067 B2 * | 10/2005 | Mistretta | .................... | 324/307 |

(Continued)

OTHER PUBLICATIONS

J. Tsao et al., "Eight-fold acceleration in real-time cardiac imaging using k-t BLAST and k-t SENSE with SSFP and Segmented EPI," Proc. Intl. Soc. Mag. Reson. Med. 11, 2003, p. 209, XP002297010, conference abstract.

(Continued)

*Primary Examiner*—Diego Gutierrez
*Assistant Examiner*—Dixomara Vargas
(74) *Attorney, Agent, or Firm*—McCormick, Paulding & Huber LLP

(57) ABSTRACT

This invention describes the combination of SSFP, a method for accelerating data acquisition, and an eddy current compensation method. This synergistic combination allows acquisition of images with high signal-to-noise ratio, high image contrast, high spatial and temporal resolutions, and good immunity against system instabilities. k-t BLAST and k-t SENSE are the preferred method for accelerating data acquisition, since they allow high acceleration factors, but other methods such as parallel imaging and reduced field-of-view imaging are also applicable. Typical applications of this invention include cine 3D cardiac imaging, and 2D real-time cardiac imaging.

11 Claims, 6 Drawing Sheets

U.S. PATENT DOCUMENTS

| | | | |
|---|---|---|---|
| 7,005,853 B2 * | 2/2006 | Tsao et al. | 324/309 |
| 7,049,816 B2 * | 5/2006 | Mistretta et al. | 324/306 |
| 2006/0049829 A1 * | 3/2006 | Takizawa et al. | 324/318 |
| 2006/0125476 A1 * | 6/2006 | Markl et al. | 324/307 |

OTHER PUBLICATIONS

S. Kozerke et al., "Accelerated Cardiac Cine 3D SSFP Imaging Using k-t BLAST with Integrated Training," Proc. Intl. Soc. Mag. Reson. Med. 11, 2003, p. 1564, XP002297011, conference abstract.

S. Kozerke et al., "Cardiac SSFP Imaging Using SENSE at 3T," Proc. Intl. Soc. Mag. Reson. Med. 10, 2002, XP002297012, conference abstract.

Schaeffter, T et al., "Projection Reconstruction Balanced Fast Field Echo for Interactive Real-Time Cardiac Imaging," Magnetic Resonance in Medicine Wiley USA, vol. 46, No. 6, 2001, pp. 1238-1241, XP002297013, ISSN: 0740-3194, see the chapter "Methods".

Jung B A et al., "Single-Breathhold 3D-TrueFISP Cine Cardiac Imaging," Magnetic Resonance in Medicine Wiley USA, vol. 48, No. 5, 2002, pp. 921-925, XP002297014, ISSN: 0740-3194, cited in the application, the whole document.

J. Tsao et al., "Prior-information-enhanced Dynamic Imaging using Single or Multiple Coils with k-t BLAST and k-t Sense," Proc. Intl. Soc. Mag. Reson. Med. 10, 2002, XP002297015, cited in the application, conference abstract.

McConnell M V et al., "Prospective Adaptive Navigator Correction for Breath-Hold MR Coronary Angiography," Magnetic Resonance In Medicine, Academic Press, Duluth, MN, US, vol. 37, No. 1, Jan. 1997, pp. 148-152, XP002203054, ISSN:0740-3194, cited in the application, see the chapter "Methods".

\* cited by examiner

SYSTEM AND METHOD OF MAGNETIC RESONANCE IMAGING FOR PRODUCING SUCCESSIVE MAGNETIC RESONANCE IMAGES

CROSS REFERENCE TO RELATED APPLICATIONS

This application claims the benefit of PCT Application No. PCT/CH2004/000387, filed on Jun. 24, 2004 and European Patent Application No. 03015012.2, filed Jul. 2, 2003, the disclosures of which are herein incorporated by reference in their entirety.

FIELD OF THE INVENTION

The present invention relates to a magnetic resonance imaging method to produce successive magnetic resonance images.

BACKGROUND OF THE INVENTION

MR imaging has been established as a viable and unique imaging technique for cardiological examinations. Its utility is related to the ability to provide both precise morphology and assessment of global and regional ventricular function. For functional assessment of the heart, steady-state free-precession (SSFP) has become an indispensable sequence due to its superb blood-to-myocardium contrast (see e.g. Oppelt A, et al. FISP: a new fast MRI sequence. Electromedica 1986; 54: 15-18.). Compared to spoiled steady-state sequences, SSFP also offers improved signal-to-noise ratio (SNR), and it allows for a shorter minimum repetition time (TR). However, the advantages of SSFP come at the expense of increased susceptibility to experimental non-idealities. As a result, it is only with recent advances in scanner hardware and sequence design that SSFP has become widely available. One prominent artifact in SSFP imaging is the so-called banding artifact. This results from unaccounted dephasing of the magnetization, such as from inhomogeneity of the main magnetic field. To reduce susceptibility to banding artifacts, it is critical to keep TR as short as possible, so that there is less time for unaccounted dephasing to occur. This, in turn, limits the use of echo-planar readout and, accordingly, acquisition efficiency of SSFP imaging is lower than in multiplanar image formation (see Mansfield P. Multiplanar image formation using NMR spin echoes. J Phys C 1977; 10: L55-58.).

SSFP can be applied in a real-time mode or in a triggered mode. In real-time mode, data are acquired in a continuous fashion. The lower acquisition efficiency of SSFP limits the achievable spatial and temporal resolutions. In the triggered mode, the idea is to "freeze" the effects of anatomical motion, which would reduce image quality. This is achieved using cardiac triggering—the coupling of image acquisition to a trigger signal—for cardiac studies, generally to an ECG signal. Using the assumption that most biological motion is rhythmic, triggering permits data acquired at different cardiac cycles but at the same point within the cycle to be combined to improve signal-to-noise ratio in the final image or to aggregate sufficient data to reconstruct a fully-sampled image. Since the images from multiple cardiac cycles are acquired at the same point within the cycle, the effects of motion are minimized. However, residual motion does exist, due to cycle-to-cycle variation, and it is manifested as image artifacts. Therefore, it is desirable to reduce the overall scan duration in order to minimize such variability. A series of images acquired at different points of the cardiac cycle can also be played back in cinematic loop fashion, called cine imaging, to provide physicians a way of viewing dynamic activities. Triggered acquisitions are generally performed in conjunction with a fast imaging pulse sequence for improved temporal resolution. The lower acquisition efficiency of SSFP mentioned previously leads to a longer overall scan duration, compared to echo-planar imaging sequences, for example.

An important application of SSFP imaging is in obtaining volumetric time-resolved images of the heart. For example, multi-slice, multi-breathhold imaging based on SSFP is currently the method of choice for obtaining cine views of the heart. From these images, functional parameters can be determined with high accuracy and reproducibility (see e.g. W. Li et. al. MR assessment of left ventricular function: quantitative comparison of fast imaging employing steady-state acquisition (FIESTA) with fast gradient echo cine technique. J. Magn. Reson. Imaging, 2002; 16, p. 559-564). There are, however, limitations associated with multi-slice, multi-breathhold acquisitions. Inconsistencies in the multiple breath-holds may lead to misregistration of slices. Furthermore, the low bandwidth-time product of the excitation pulses used for short TR SSFP imaging results in large variations of excitation angles within the slice. This not only affects the signal-to-noise and contrast-to-noise ratios, it also hampers the reconstruction of multi-planar reformats through the heart due to the slab boundary artifact.

To overcome the aforementioned shortcomings, SSFP with true 3D imaging was previously developed (see B. A. Jung et. al. Single-breathhold 3D-true FISP cine cardiac imaging. Magn. Reson. Med. 2002; 48, p. 921-925). Cine 3D SSFP of the heart was shown to offer superior signal-to-noise and contrast-to-noise ratios compared to multislice sequences. However, in that work, compromises between image quality, spatial and temporal resolutions had to be made to accommodate sufficient volume coverage into a single breath-hold. Using an elliptical shutter in $k_y$-$k_z$ space, cine volumetric data sets may be obtained at relatively high spatial resolution in a single breathhold. Still, temporal sampling does not satisfy the requirements for accurate left ventricular volume calculations. Generally, at least 10 temporal frequency harmonics are considered sufficient for accurate volume curve calculation, requiring a sampling rate of at least 20×HR/60 Hz, with HR being the actual heart rate.

SUMMARY OF THE INVENTION

It is an object of the present invention to speed up SSFP dynamic imaging, particularly by a high acceleration factor. The acceleration factor is defined as the ratio between the acquisition time of a conventional scan with full sampling of the data to the acquisition time of an accelerated scan with reduced data sampling.

This object is achieved by an MR imaging method wherein a series of successive magnetic resonance signals is obtained by steady-state free precession imaging. The successive magnetic resonance signals in the series are acquired by successively scanning respective set points in k-space in an undersampled fashion. The magnetic resonance signals in the series are acquired in conjunction with an eddy current reduction technique, and successive magnetic resonance images are reconstructed from the successive sets of magnetic resonance signals using a suitable reconstruction method. A practical use of this invention, as described in detail below, is in accelerating cardiac cine 3D imaging in order to obtain a sequence of cine images in a much shorter time or with a higher temporal resolution for a fixed acquisition duration. Another promising use of this invention is in accelerating free-breathing, untriggered (referred to as real-time hereafter) imaging to achieve higher spatial and/or temporal resolutions.

The present invention is based on the knowledge that the high intrinsic signal-to-noise and contrast-to-noise ratios of SSFP imaging make it a good candidate for reduced data acquisition schemes. Moreover, sparse sampling of k-space may allow shortening of scan time. At the same time, shorter scan time have the added benefit of reducing the overall power deposited in the subject, which is a concern for cardiac SSFP imaging especially at higher field strengths.

However, accelerated SSFP is prone to image artifacts resulting from instabilities of the gradient hardware system, such as eddy currents. The gist of this invention is to modify the profile order (also known as the phase-encode order) to reduce the said artifacts. These artifacts are often present in SSFP, but they generally remain at low level in practice. Therefore, linear profile order sampling in k-space prevails, particularly in 2D imaging. In the case of high acceleration factors, which are desirable in terms of reduced scan time or increased spatiotemporal resolutions, these artifacts are amplified drastically. In those cases, the resulting image artifacts overwhelm the image contents and must be suppressed.

BRIEF DESCRIPTION OF THE DRAWINGS

Further advantages of the invention are disclosed in the claims and in the following description in which an exemplified embodiment of the invention is described with respect to the accompanying drawings.

FIGS. 8 to 8a-c shows a cine 3D single breath-hold data set obtained with 5x k-t BLAST in a cardiac patient.

DESCRIPTION OF PREFERRED EMBODIMENTS

The MR method according to the present invention is based on an approach for accelerated data acquisition in dynamic imaging, called k-t BLAST (Broad-use Linear Acquisition Speed-up Technique) and k-t SENSE (SENSitivity Encoding). The k-t BLAST and k-t SENSE methods are described in an abstract byJ. Tsao et. al. (Prior-information-enhanced Dynamic Imaging using Single or Multiple Coils with k-t BLAST and k-t SENSE. Proc. Int. Soc. Magn. Reson Med., Abstract 2369. 2002).

The present invention and the subject matter of U.S. Pat. No. 7,005,853 B2 to Tsao et al. were made by or on behalf of the parties to a joint research agreement within the meaning of U.S.C. § 103(c)(3), the parties being Philips Medical Systems Nederland B.V. (an affiliate company of Koninklijke Philips Electronics N.V.). Universität Zürich and ETH Zürich.

In the following, the k-t BLAST method is briefly reviewed. k-t SENSE is similar, but it additionally takes the complex sensitivity information of the receiver coils into account, and it is described in detail in the aforementioned document.

Figure 1:
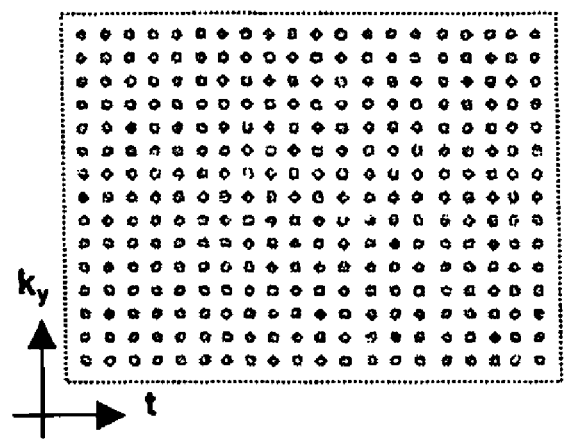
FIG. 1 shows a regular sampling pattern of magnetic resonance signals.
Figure 2:
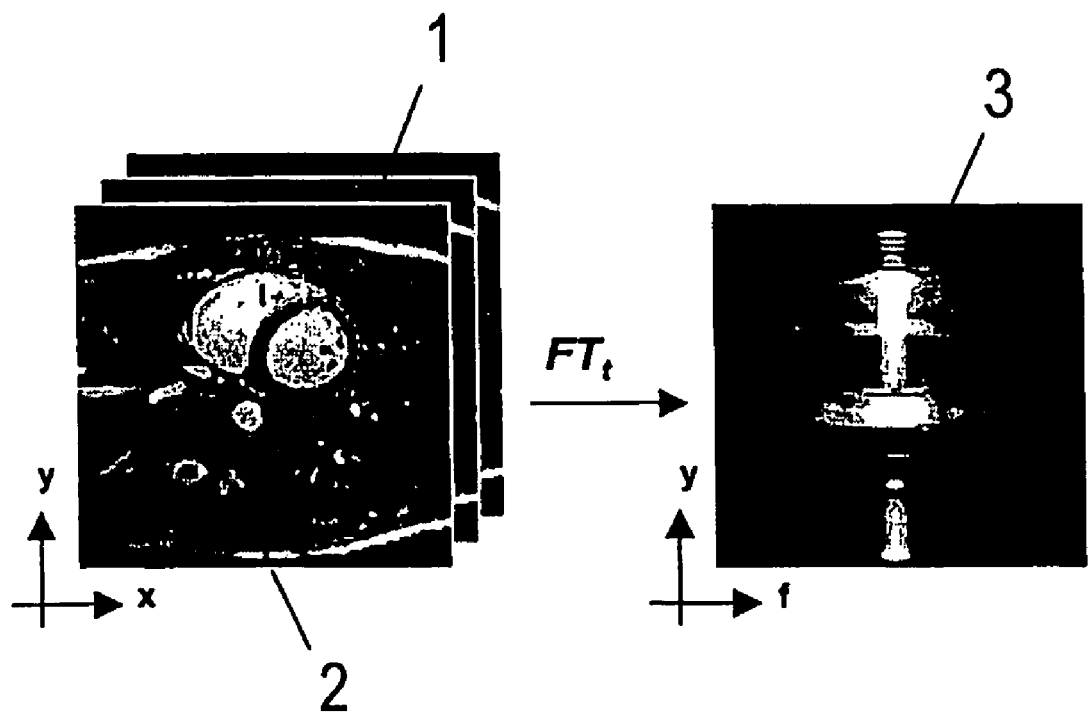
FIG. 2 shows a time series of fully sampled images 1 and corresponding signal distribution of object intensities 3 along the dashed line 2 after inverse Fourier transform over time.
Figure 3:
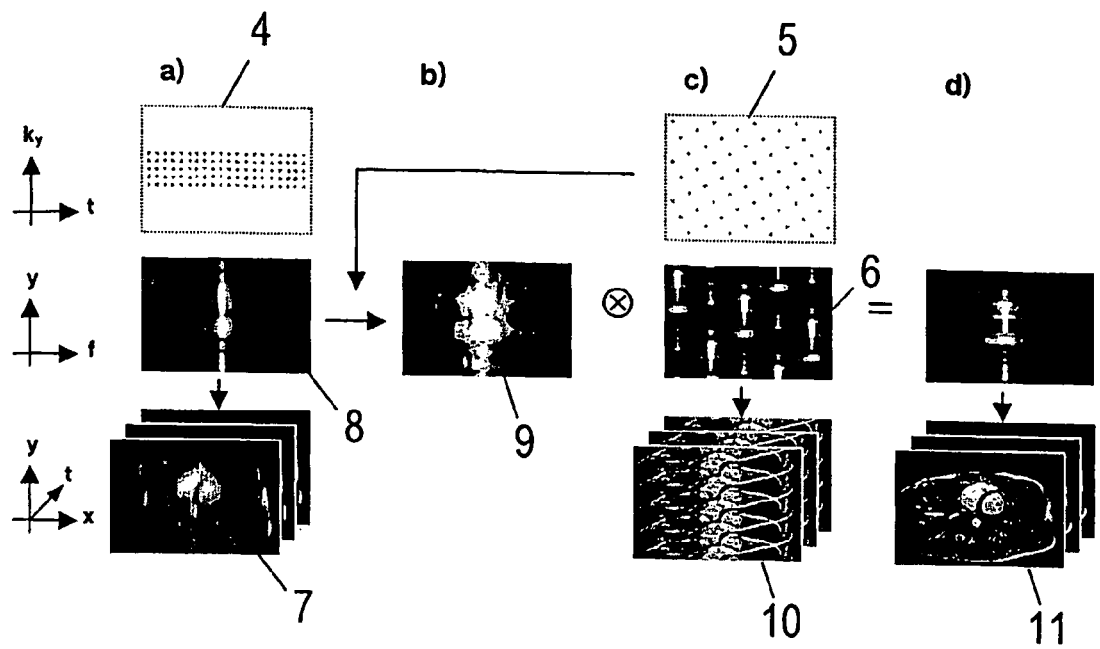
FIG. 3 shows a schematics of the k-t BLAST method.

Image content in a cine series of the heart exhibits a high degree of correlation in both space and time. This is demonstrated in FIGS. 1 and 2. FIG. 1 shows the sampling pattern in k-t space (k=wavenumber, t=time), indicating that k-space is fully sampled at every time point t. The density and extent of sampling in k-space are chosen according to the desired field of view and resolution, respectively. FIG. 2 shows the corresponding fully-sampled, cine short-axis acquisition of the heart 1. Image information along a vertical profile 2 through the heart (FIG. 2) is confined to compact regions in x-f space 3 (x=spatial position, f=temporal frequency), according to the dynamics of the corresponding image pixels. In the k-t BLAST method, acquisition efficiency is increased by applying sparse sampling to k-t space according to a sheared grid pattern 5 (FIG. 3c). This results in a tighter packing of signal replica in the reciprocal x-f space 6. Using low-resolution image information sampled for all cardiac phases 7 (FIG. 3a), an estimate 8 of the expected signal distribution in x-f space is obtained, which is used to determine a reconstruction filter 9 (FIG. 3b). The sparse sampling in the actual, high-resolution acquisition results in multiple replica 6 in x-f space, which in turn manifest as multiple fold-over in the actual image series 10 (FIG. 3c). By multiplying the acquired, high-resolution data 6 with the reconstruction filter 9, an unfolded image series 11 is obtained after Fourier transform along the time axis (FIG. 3d).

The following describes the data acquisition scheme for a typical application of the present invention: 3D single-breath cine SSFP cardiac imaging. In addition, the following describes the problem with a straightforward implementation and describes the solution to overcome this problem. The solution is part of the present invention.

Figure 4:
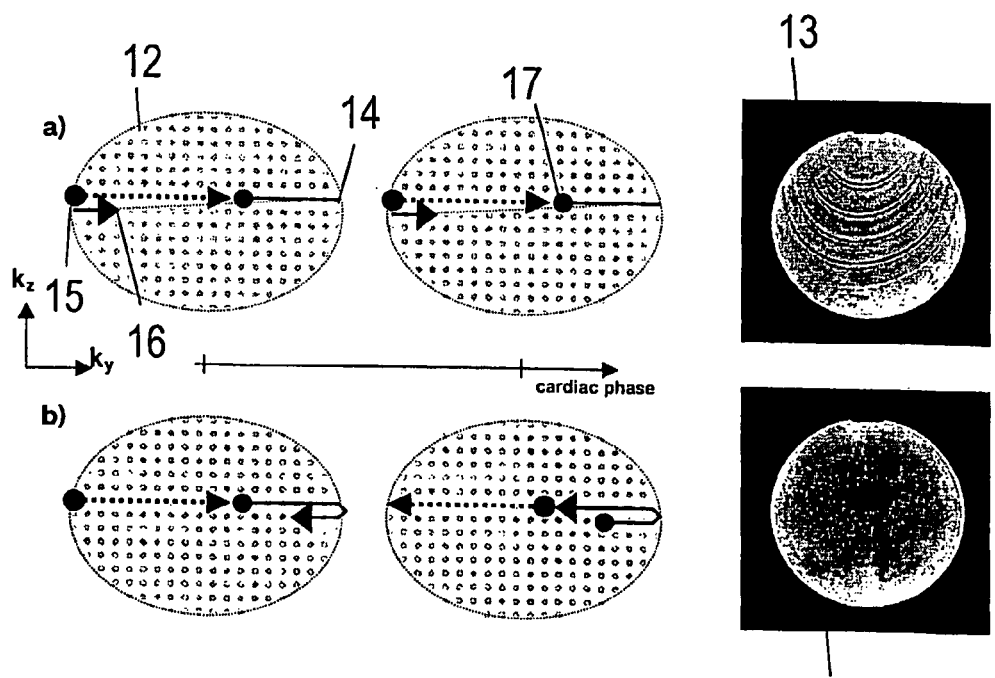
FIGS. 4a-4d show a cine 3D SSFP: influence of sampling order on image artifacts.

Sampling along a sheared grid pattern was implemented into the acquisition software of a Philips Gyroscan Intera system (Philips Medical Systems, Best, The Netherlands). An elliptical k-space shutter 12 was applied to reduce the number of points to be sampled by approximately 25% by skipping the corners of k-space (FIG. 4a). The straightforward approach of sampling k-space is to use a linear profile order, which is the default order, but it leads to image artifacts 13 (FIG. 4c). These artifacts originate from the fact that at the end of each $k_z$ line 14, the $k_z$ position is incremented by one, but the $k_y$ position now jumps to the starting position on the next $k_z$ line 15. This will be referred to as a line jump hereafter. Usually, when the jump is small, the rewinding gradient is similar in magnitude but opposite in polarity to the phase-encoding gradient, so eddy currents generated by the former are well compensated by those of the latter. In the case of line jumps, the eddy currents are not compensated, resulting in image artifacts. The same also applies at the end of each cardiac phase 16. At that point, both the $k_y$ and $k_z$ positions jump back to the starting positions in the next cardiac phase 17. The jump is usually small for $k_z$ but can be quite large in $k_y$, potentially leading to eddy current problems.

For a well tuned gradient system, these artifacts should be relatively small. Particularly for 2D imaging, these artifacts are almost at a negligible level 19 (FIG. 5a) (see B. A. Jung et. al. Magn. Reson. Med. 2002; 48, p. 921-925). However, these artifacts are drastically amplified in case of accelerated acquisition 20, particularly at high acceleration factors. This is due to two reasons. Firstly, k-space is sampled sparsely in order to accelerate the acquisition. This means that larger jumps 21 are involved going from one profile to the next, thereby resulting in more residual eddy currents. Secondly, since fewer profiles are acquired at each time point or cardiac phase, the line jumps occur more frequently. For example, suppose that in real-time 2D imaging, N profiles are acquired. If the usual linear profile order is used, a line jump would occur after every N lines. If the acquisition is accelerated by, for example, 8-fold, a line jump would occur after every N/8 lines. Therefore, the large jumps in k-space occur more frequently, and the generated eddy currents remain significant for the most part of data acquisition, so the acquired data are contaminated strongly by image artifacts.

To reduce eddy-current related distortions induced by the changing phase encoding gradients, the present invention employs a known eddy current compensation technique (see B. A. Jung et. al. Magn. Reson. Med. 2002; 48, p. 921-925). Previously, this technique was only used for unaccelerated scans, for which the eddy current artifacts remain relatively mild for a well tuned hardware system, as mentioned. Therefore, it was even mentioned that such a compensation technique was unnecessary in the case of 2D imaging (see B. A. Jung et. al. Magn. Reson. Med. 2002; 48, p. 921-925).

Figure 5:
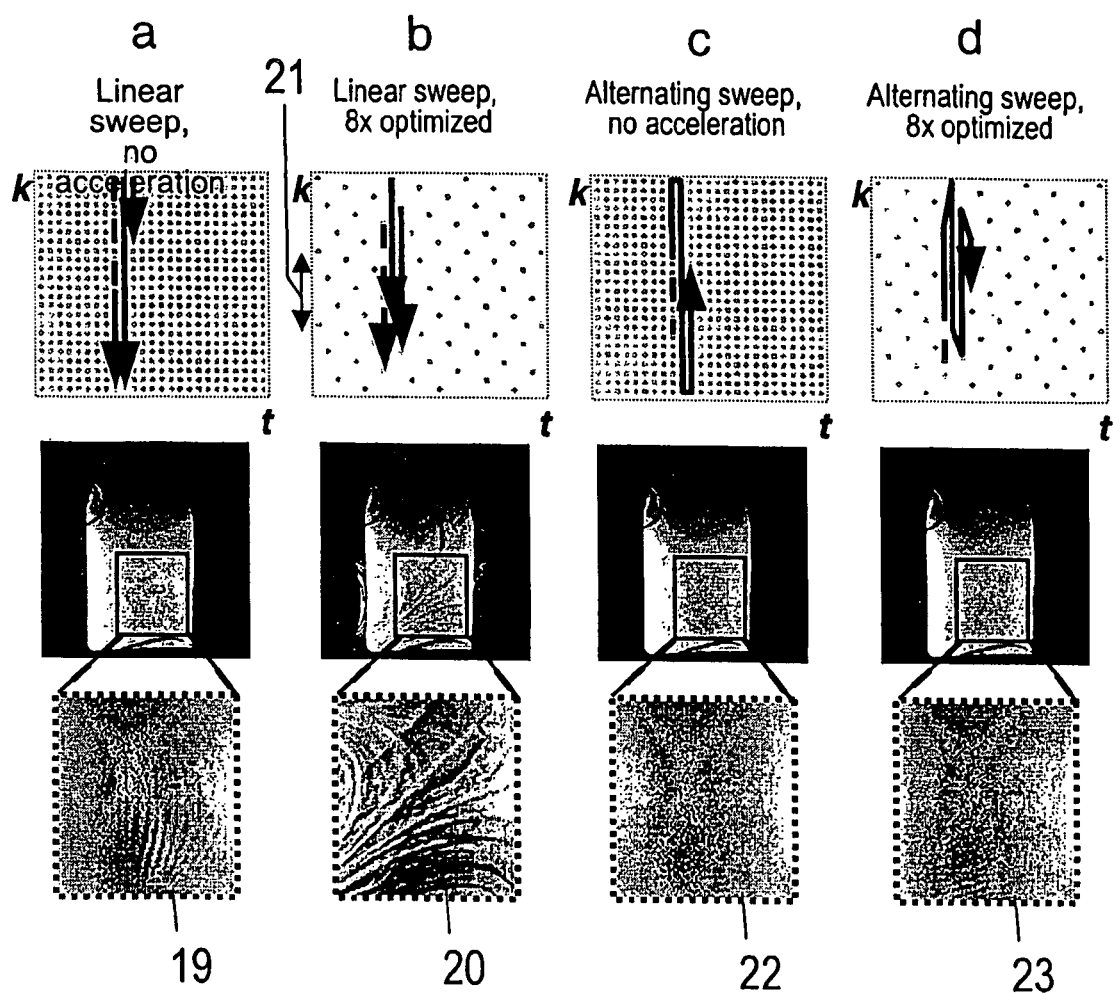
FIGS. 5a-5d show a real-time 2D SSFP: influence of sampling order on image artifactsL

The present invention is further based on the observation that the eddy-current artifacts are drastically amplified with accelerated data acquisition. As a result, an eddy-current reduction technique, such as the said technique, must be used, even in the case of 2D imaging. In the said technique for eddy-current reduction, an alternating profile order is used to minimize the large jumps in k-space. For example, in 2D real-time imaging, the profiles are ordered such that k-space is swept along one direction at one time point, and along the opposite direction in the next time point (see arrow indicating seep direction in FIGS. 5c and 5d). This profile order significantly reduces the image artifacts both in normal unaccelerated acquisition 22 (FIG. 5c) and in highly accelerated (e.g. 8-fold) acquisition 23 (FIG. 5d). In cine 3D acquisition, consecutive profiles in the $k_y$-$k_z$ plane are traversed in a contiguous fashion with the overall direction of sampling being reversed for odd cardiac phases (FIG. 4b). Thus, the eddy-current reduction technique employs alternating sweep directions in sampling k-space. This alternating profile order scheme for subsequent $k_z$ profiles and cardiac phases reduces eddy-current related distortions by ensuring maximum compensation of phase-encode gradient lobes, which leads to substantial reduction in image artifacts, (FIG. 4d) 18.

It should be noted that the large jumps in k-space and the resulting eddy-current problems may also affect other imaging applications as well, including parallel imaging at high acceleration factors, and reduced field-of-view imaging with a highly reduced field of view. Previously, this problem had not been reported in those applications because they are generally unable to achieve the high acceleration factors used in the present invention. For parallel imaging, this problem may begin to arise due to the recent interest in using higher magnetic field strengths. At higher field strengths, the achievable acceleration factor is also increased, so the aforementioned problem is expected, and the proposed solution can be applied to that application as well.

Typical Embodiment: 3D Cine Cardiac Imaging

Figure 6:
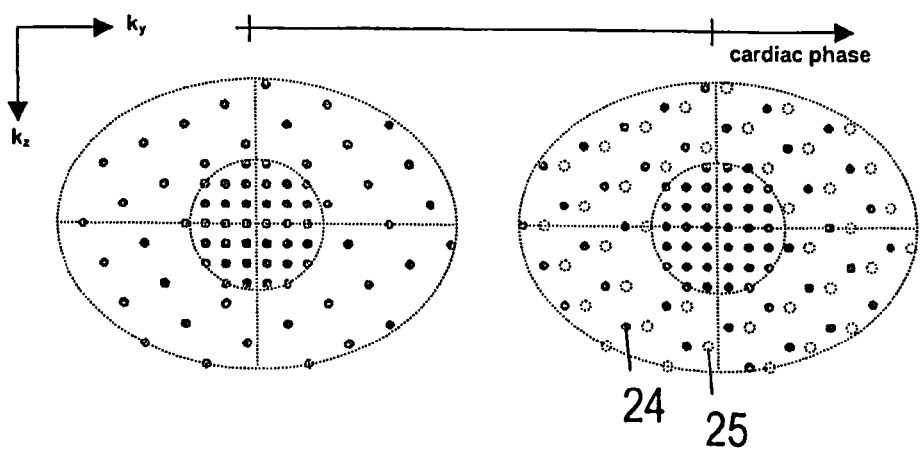
FIG. 6 shows the sampling pattern for cine 3D k-t BLAST with integrated training data.

Using 5-fold undersampling (5×k-t BLAST), volumetric data sets covering the heart with 20 slices at a spatial resolution of 2×2×5 mm$^3$ were recorded with 20 cardiac phases in a single breathhold of 20-22 sec. with the training data acquired in a separate 5 sec prescan. When the training data were acquired together with the undersampled data in a single scan (referred to as interleaved acquisition hereafter), the breathhold duration was prolonged slightly to 25-27 sec. The central, densely-sampled region in the $k_y$-$k_z$ plane consisted of 49 profiles providing low-resolution images without aliasing. A schematic of the sampling pattern applied is given in FIG. 6. The central portion of the $k_y$-$k_z$ space is sampled at the full FOV in each cardiac phase whereas the outer portion is under-sampled by a factor of five with the pattern being shifted as a function of cardiac phase. The gray dots 24 indicate the sampled points, the dashed dots 25 represent points sampled in the previous cardiac phase. Remaining acquisition parameters were as follows: FOV: 320×210 mm$^2$, TE/TR: 1.55/3.1 ms, flip angle: 45 deg., heart phase interval: 28-35 ms. Taking the acquisition of low-resolution training data into account, the net acceleration factor was 4.3.

Navigator-based volume tracking (see e.g. M. V. McConnell et. al. Prospective adaptive navigator correction for breath-hold MR coronary angiography. Magn. Reson. Med. 1997; 37, p. 148-152) was implemented in order to ensure consistency between the low-resolution, fully sampled data and the high-resolution, under-sampled data when the two datasets were acquired in separate acquisitions. Using pencil-beam excitation on the diaphragm, the navigator signal corresponding to the breath-hold position in the first acquisition was recorded and correlated with a navigator acquired prior to the second acquisition. Volume tracking was applied to account for possible shifts in breath-hold positions.

Image Reconstruction

The data were divided into two sets for reconstruction: a training set (FIG. 3a) and an under-sampled set (FIG. 3c). The training set consisted of the densely sampled central region of k-space only 4; while the under-sampled set consisted of all the data sampled along the sheared grid pattern 5. Both data sets were inverse Fourier transformed along all axes. The training set yielded a set of low-resolution images in x-f space 8, while the under-sampled set yielded a set of aliased images in x-f space 6. For each set of aliased voxels in x-f space, the aliasing was resolved by the following equation:

$$p = p_{DC} + |\Theta E^H (E\Theta E^H + \Psi)^{-1} (a - a_{DC})$$

Vector p represents the reconstructed (unaliased) intensities. Θ is a diagonal matrix, with the diagonal elements representing the squared expected intensities, as determined from the training data. E denotes the encoding matrix, representing the process of aliasing. Ψ is the noise variance of the acquisition data. Vector a holds the aliased intensity of the voxels. The time-averaged signals of the object ($a_{DC}$) were subtracted prior to reconstruction. After reconstruction, the object corresponding to the time-invariant signals ($p_{DC}$) was added back. The square-bracketed portion corresponds to the reconstruction filter 9 as shown in FIG. 3b. The training data were substituted into the reconstructed image for improved data consistency, if the training data were acquired in an interleaved fashion. To reduce computation, reconstruction was performed separately for each coil element, and the reconstructed images were combined afterwards as the root-mean-square of the coil images. In general, k-t SENSE, which takes into account the complex sensitivities of the receiver coils, may also be used, instead of the coil-by-coil k-t BLAST reconstruction described above.

In-Vivo Validation

The study population consisted of four healthy volunteers and four cardiac patients undergoing cardiac MR imaging for assessment of congenital heart disease. In both groups, conventional, multi-slice 2D SSFP acquisitions were obtained additionally for comparison, which required 9 sec per slice. Each slice was acquired in a separate single breath-hold with imaging parameters comparable to the single breath-hold 3D k-t BLAST acquisition. Left ventricular contours were extracted using standard post-processing software, and the contour area from the single-slice and 3D acquisitions was compared.

Results 3D data sets were successfully acquired in all subjects. Nearly artifact-free 3D volumes were reconstructed, allowing reformatting along arbitrary views. Slight image ghosting remained from residual eddy-current effects. In a few subjects with large variations of the R-R interval during the breath-hold, early diastolic frames exhibited a small degree of blurring.

Figure 7:
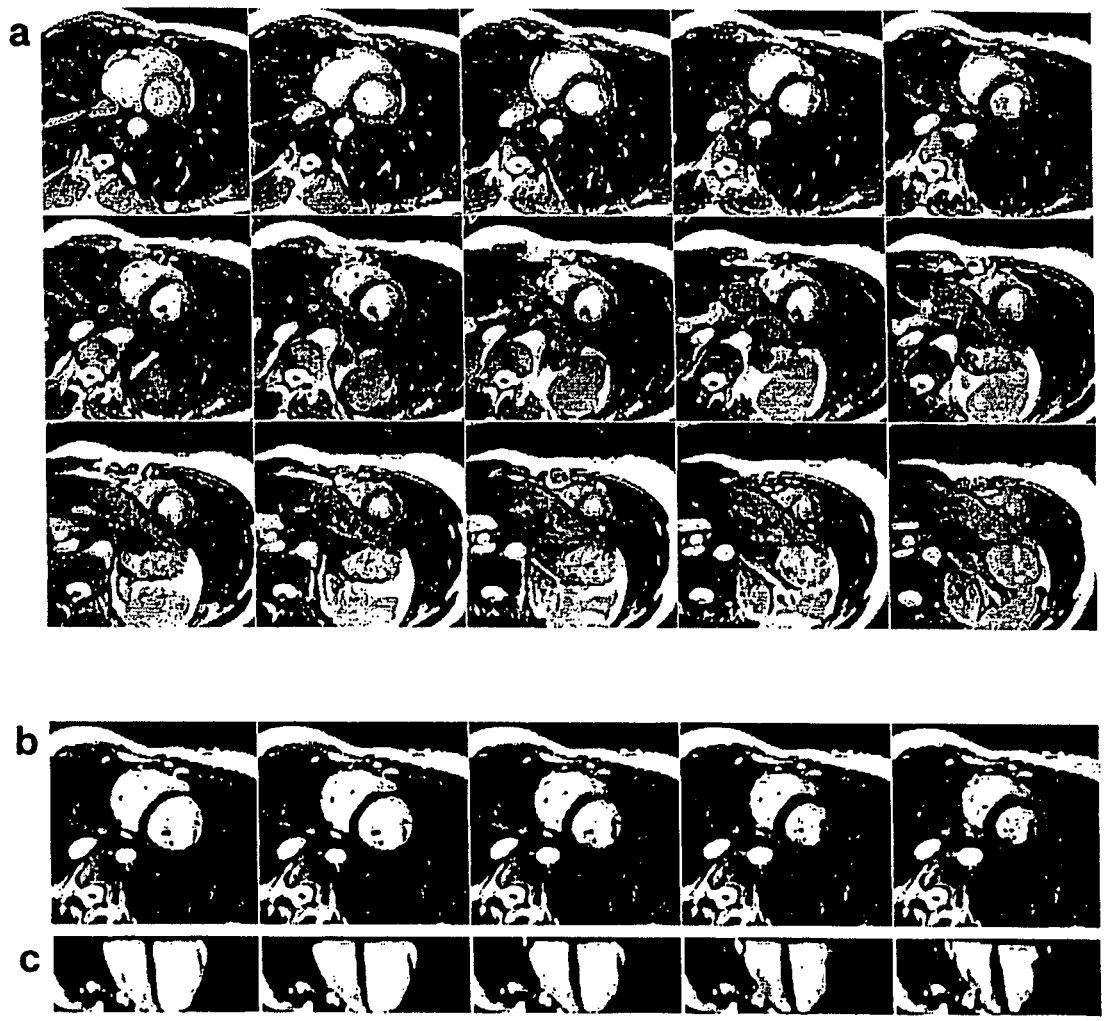
FIGS. 7a-7c show a cine 3D single breath-hold data set obtained with 5x k-t BLAST in a volunteer.

In FIG. 7a, a cine 3D single breath-hold data set of central fifteen slices at the end systolic phase of a 5× k-t BLAST acquisition obtained in a healthy subject is shown. FIGS. 7b and c depict selected time frames of a mid-ventricular short-axis slice (FIG. 7b) along with reformatted four-chamber views (FIG. 7c). The actual temporal resolution was 35 msec.

Figure 8:
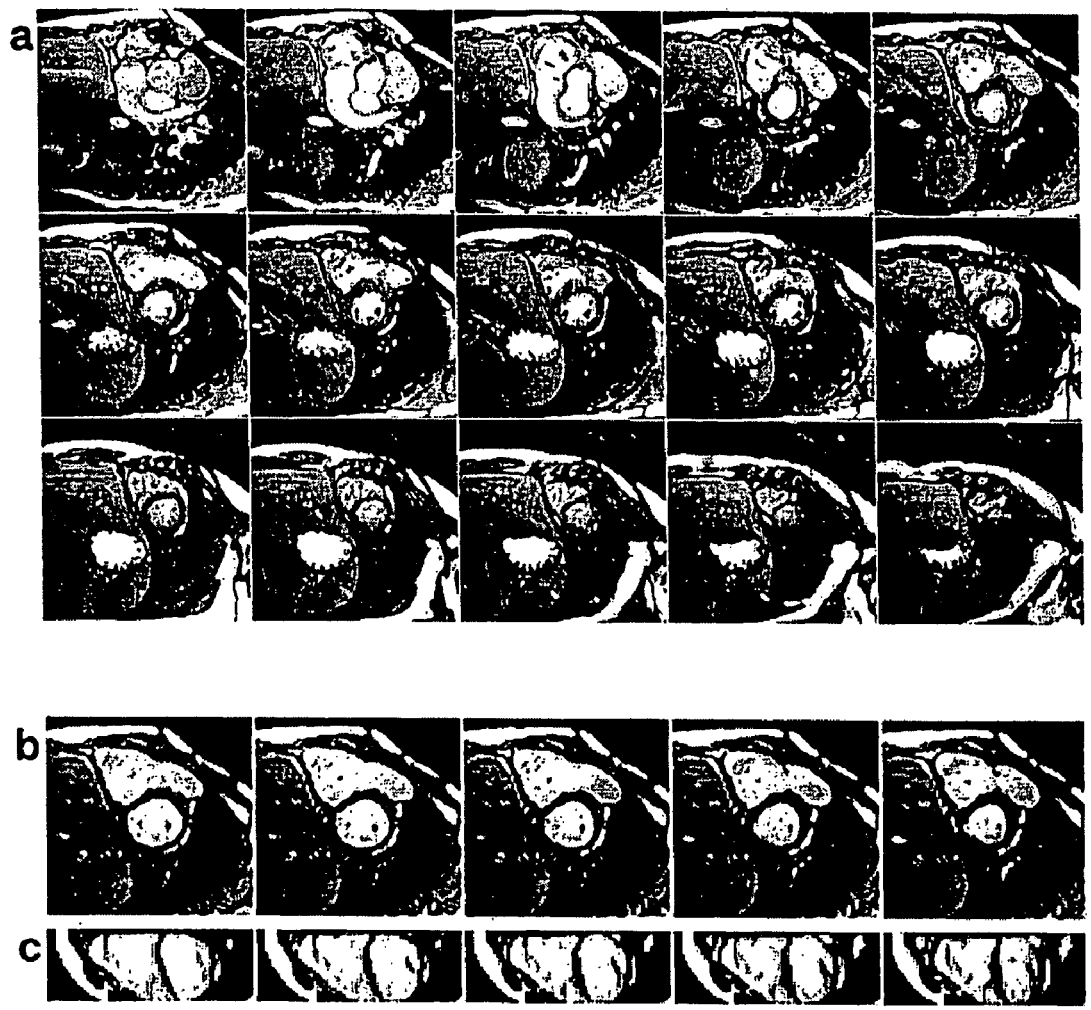

FIG. 8 shows example images obtained from one of the patients who had repaired Tetralogy of Fallot and pulmonary regurgitation causing right ventricular dilation. In all patients, training data were obtained in a separate prescan, lasting 5 sec, in order to allow shorter breath-hold durations of the high-resolution 3D acquisition. The data set was obtained similar to the set of FIG. 7 with 5× k-t BLAST. The actual temporal resolution was 28 msec.

In in-vivo validation, the mean difference of left ventricular contours extracted in three exemplary slices of the 3D data set and the multi-slice 2D acquisition was 3.41±6.52%.

In the present invention it is shown that k-t BLAST can be applied successfully to cine 3D acquisition of the heart at 5-fold acceleration. The increased scan efficiency allows the acquisition of volumetric data sets of the heart at high spatial ($2 \times 2 \times 5$ mm$^3$) and temporal (28-35 ms) resolutions in a single breath-hold lasting 20-22 sec (for a heart rate of 55-80 beats/min), with the training data being obtained separately. The acquisition strategy is well tolerated by healthy subjects and patients.

The modified profile order according to the invention proved to be important even for 2D imaging, particularly when high acceleration factors are used. The invention proved effective in reducing eddy-current related image artifacts by eliminating the frequent large jumps in k-space associated with sparse sampling. In cine imaging, residual artifacts are considered to be related to the varying number of dummy cycles at the end of each cardiac cycle, depending on the R-R interval. Further improvements in eddy current reduction can be achieved by using dummy cycles after each trigger to provide sufficient time for the eddy currents to decay, or to smooth any k-space jumps.

To ensure consistency between breathhold levels when training data are acquired in a separate prescan, navigator-based volume tracking is applied. The correction factor is set to 0.8, which is considered only a rough estimate of the correlation between diaphragm and heart displacement. Inaccuracies, however, do not affect reconstruction to a large extend as training data are of very low spatial resolution ($2 \times 23 \times 11$ mm$^3$).

Figure 9:
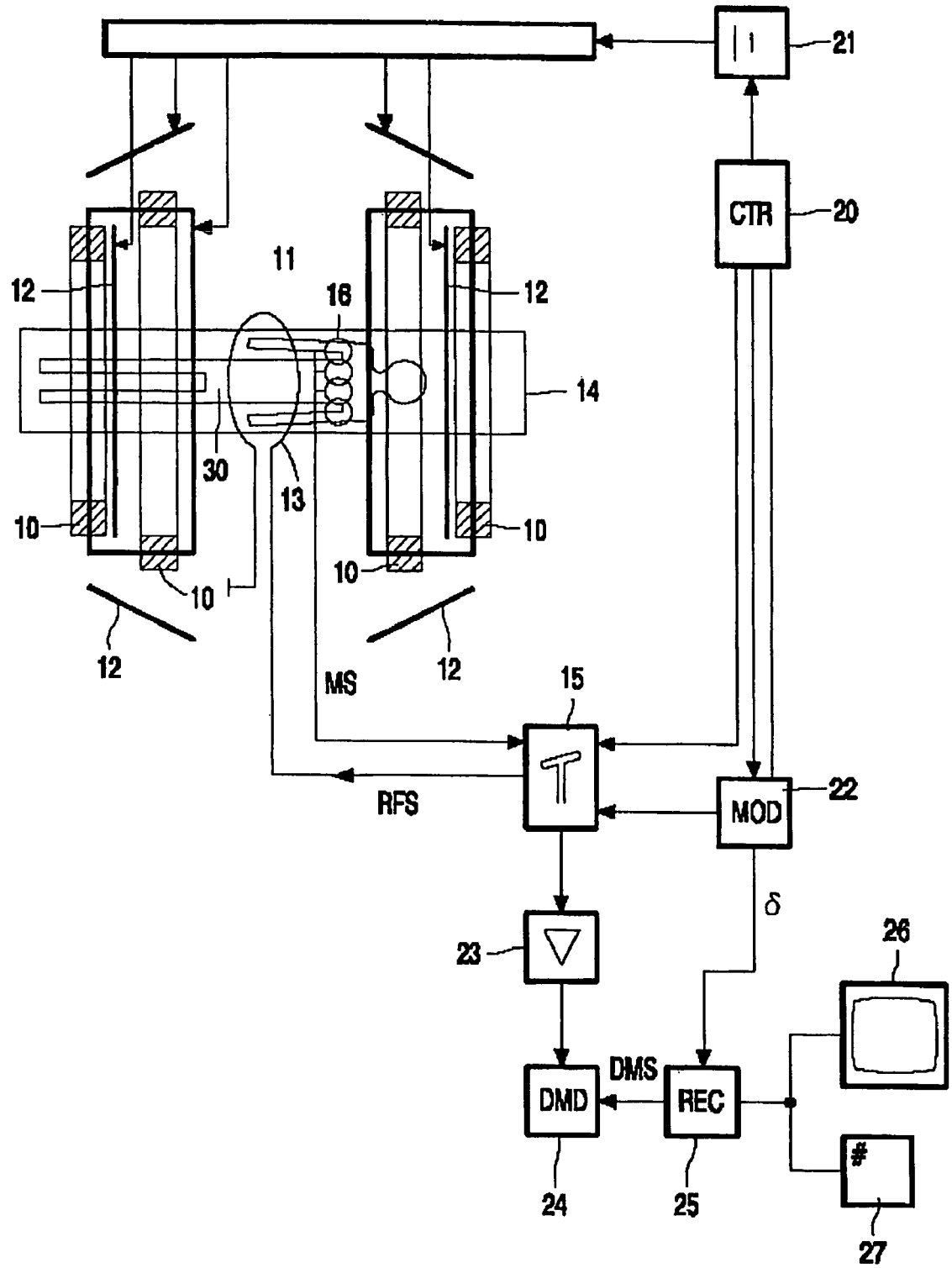
FIG. 9 shows a diagrammatically a magnetic resonance imaging system.

FIG. 9 shows diagrammatically a magnetic resonance imaging system in which the invention is used.

The magnetic resonance imaging system includes a set of main coils 10 whereby a steady, uniform magnetic field is generated. The main coils are constructed, for example in such a manner that they enclose a tunnel-shaped examination space. The patient to be examined is slid on a table 34 into this tunnel-shaped examination space. The magnetic resonance imaging system also includes a number of gradient coils 31, 32 whereby magnetic fields exhibiting spatial variations, notably in the form of temporary gradients in individual directions, are generated so as to be superposed on the uniform magnetic field. The gradient coils 31, 32 are connected to a controllable power supply unit 40, 41. The gradient coils 31, 32 are energized by application of an electric current by means of the power supply unit. The strength, direction and duration of the gradients are controlled by control 40 of the power supply unit. The magnetic resonance imaging system also indudes transmission and receiving coils 33, 36 for generating RF excitation pulses and for picking up the magnetic resonance signals, respectively. The transmission coil 33 is preferably constructed as a body coil whereby (a part of) the object to be examined can be enclosed. The body coil is usually arranged in the magnetic resonance imaging system in such a manner that the patient 50 to be examined, being arranged in the magnetic resonance imaging system, is enclosed by the body coil 33. The body coil 33 acts as a transmission aerial for the transmission of the RF excitation pulses and RF refocusing pulses. Preferably, the body coil 33 involves a spatially uniform intensity distribution of the transmitted RF pulses. The receiving coils 36 are preferably surface coils 36 which are arranged on or near the body of the patient 50 to be examined. Such surface coils 36 have a high sensitivity for the reception of magnetic resonance signals which is also spatially inhomogeneous. This means that individual surface coils 36 are mainly sensitive for magnetic resonance signals originating from separate directions, i.e. from separate parts in space of the body of the patient to be examined. The coil sensitivity profile represents the spatial sensitivity of the set of surface coils. The receiving coils, notably surface coils, are connected to a demodulator 44 and the received magnetic resonance signals (MS) are demodulated by means of the demodulator. The demodulated magnetic resonance signals (DMS) are applied to a reconstruction unit 45. The reconstruction unit reconstructs the magnetic resonance image from the demodulated magnetic resonance signals (DMS) and optionally on the basis of the coil sensitivity profile of the set of surface coils. The coil sensitivity profile has been measured in advance and is stored, for example electronically, in a memory unit which is included in the reconstruction unit. The reconstruction unit 45 derives one or more image signals from the demodulated magnetic resonance signals (DMS), which image signals represent one or more, possibly successive magnetic resonance images. This means that the signal levels of the image signal of such a magnetic resonance image represent the brightness values of the relevant magnetic resonance image. The reconstruction unit 45 in practice is preferably constructed as a digital image processing unit 45 which is programmed so as to reconstruct the magnetic resonance image from the demodulated magnetic resonance signals and optionally on the basis of the coil sensitivity profile. The digital image processing unit 45 is notably programmed so as to execute the reconstruction in conformity with the present invention. The image signal from the reconstruction unit is applied to a monitor 46 so that the monitor can display the image information of the magnetic resonance image (images). It is also possible to store the image signal in a buffer unit 47 while awaiting further processing, for example printing in the form of a hard copy.

In order to form a magnetic resonance image or a series of successive magnetic resonance images of the patient to be examined, the body of the patient is exposed to the magnetic field prevailing in the examination space. The steady, uniform magnetic field, i.e. the main field, orients a small excess number of the spins in the body of the patient to be examined in the direction of the main field. This generates a (small) net macroscopic magnetization in the body. These spins are, for example nuclear spins such as of the hydrogen nuclei (protons), but electron spins may also be concerned. The magnetization is locally influenced by application of the gradient fields. For example, the gradient coils apply a selection gradient in order to select a more or less thin slice of the body. Subsequently, the transmission coils apply the RF excitation pulse to the examination space in which the part to be imaged of the patient to be examined is situated. The RF excitation pulse excites the spins in the selected slice, i.e. the net magnetization then performs a precessional motion about the direction of the main field. During this operation those spins are excited which have a Larmor frequency within the frequency band of the RF excitation pulse in the main field. However, it is also very well possible to excite the spins in a part of the body which is much larger than such a thin slice; for example, the spins can be excited in a three-dimensional part which extends substantially in three directions in the body. After the RF excitation, the spins slowly return to their initial state and the macroscopic magnetization returns to its (thermal) state of equilibrium. The relaxing spins then emit magnetic resonance signals. Because of the application of a read-out gradient and a phase encoding gradient, the magnetic resonance signals have a plurality of frequency components which encode the spatial positions in, for example the selected slice. The k-space is scanned by the magnetic resonance signals by application of the read-out gradients and the phase encoding gradients. According to the invention, the application of notably the phase encoding gradients results in the sub-sampling of the k-space, relative to a predetermined spatial resolution of the magnetic resonance image. For example, a number of lines which is too small for the predetermined resolution of the magnetic resonance image, for example only half the number of lines, is scanned in the k-space.

The invention claimed is:

1. A magnetic resonance imaging method to produce successive magnetic resonance images of a region of a subject comprising the steps of:
   exposing the body of a subject to a uniform magnetic field,
   obtaining a series of successive magnetic resonance signals of the region of the subject by steady-state free precession imaging,
   acquiring successive sets of the magnetic resonance signals in the series by successively scanning respective sets of points in k-space in an undersampled fashion such that the ensemble of successive sets cover the entire portion of k-space at full sampling density, the step of acquiring including employing an eddy-current reduction technique,
   obtaining successive updates of a training set of magnetic resonance signals from the magnetic resonance signals by further acquisition of a central portion of k-space at full sampling density,
   updating the undersampled sets of magnetic resonance signals using further undersampled scans of the entire k-space,
   reconstructing a baseline image from the training data,
   identifying a distribution of a likelihood of changes in the successive magnetic resonance images from the training data, in the space spanned by geometrical space,
   reconstructing successive magnetic resonance images from the respective sets of undersampled magnetic resonance signals on the basis of the identified distribution of likelihood of changes, and wherein
   the step of acquiring including acquiring the magnetic resonance signals by way of a receiver antennae system having a spatial sensitivity profile, and
   the step of reconstructing further including reconstructing the successive magnetic resonance images from the respective sets of undersampled magnetic resonance signals based in part on the sensitivity profile of the receiver antennae.

2. The magnetic resonance imaging method as claimed in claim 1, wherein the eddy-current reduction technique employs alternating sweep directions in sampling k-space.

3. The magnetic resonance imaging method as claimed in claim 1 further comprising the step of reconstructing successive magnetic resonance images from the respective sets of undersampled magnetic resonance signals including utilizing a reduced field of view, where changes in image contents are assumed to take place.

4. The magnetic resonance imaging method as claimed in claim 1, wherein an elliptical k-space shutter is applied.

5. The magnetic resonance imaging method as claimed in claim 1, wherein navigator-based volume tracking is applied.

6. A computer application stored on a computer-readable medium for producing successive magnetic resonance images of a region of a subject, the computer application comprising executable instructions to:
   obtain a series of subsequent magnetic resonance signals of a region of a subject by steady-state free precession imaging,
   apply an eddy-current reduction technique, such as by alternating the sweep directions of sampling in k-space,
   acquire a set of magnetic resonance signals in an undersampled fashion, and
   reconstruct successive magnetic images of the region from the successive sets of magnetic resonance signals,
   identify a distribution of a likelihood of changes in the successive magnetic resonance images from a training set in the space spanned by geometrical space or geometrical space and temporal frequency wherein the instructions to reconstruct the successive magnetic images of the region from the successive sets of magnetic resonance signals are based in part on the distribution of likelihood of changes.

7. The computer application in accordance with claim 6 wherein the magnetic resonance signals are acquired using a receiver antennae system having a spatial sensitivity profile.

8. The computer application in accordance with claim 6 further including instructions for obtaining successive updates of a training set of magnetic resonance signals from the magnetic resonance signals by further acquisition of a central portion of k-space at full sampling density.

9. The computer application according to claim 8 including instructions for reconstructing a baseline image from one of the undersampled signals, the training set of signals, and data acquired separately during periods with little or no motion.

10. The computer application according to claim 9 including instructions for reconstructing the successive magnetic resonance images from the magnetic resonance signals based in part on the baseline image.

11. The computer application according to claim 6 wherein the instructions to reconstruct the successive magnetic images of the region from the successive sets of magnetic resonance signals include utilizing a reduced field of view where changes in image content are assumed to take place.

* * * * *